(12) United States Patent
Tabatabai (10) Patent No.: US 6,924,712 B2
(45) Date of Patent: Aug. 2, 2005

(54) SEMI-SUSPENDED COPLANAR WAVEGUIDE ON A PRINTED CIRCUIT BOARD

(75) Inventor: Mohammad Tabatabai, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/354,068

(22) Filed: Jan. 30, 2003

(65) Prior Publication Data

US 2004/0150487 A1 Aug. 5, 2004

(51) Int. Cl.⁷ .................................................. H01P 3/08
(52) U.S. Cl. ...................... 333/4; 333/238; 174/117 AS
(58) Field of Search ............................ 333/1, 4, 5, 238; 174/117 AS (56) References Cited

U.S. PATENT DOCUMENTS 2,800,634 A * 7/1957 Engelmann et al. ........ 333/238

* cited by examiner

Primary Examiner—Benny Lee
(74) Attorney, Agent, or Firm—Sterne, Kessler, Goldstein & Fox P.L.L.C.

(57) ABSTRACT

A printed circuit board includes two differential signal traces, a layer of core material, a layer of filler material, and a ground plane. The filler material is replaced by an air core under the differential signal traces.

13 Claims, 13 Drawing Sheets

SEMI-SUSPENDED COPLANAR WAVEGUIDE ON A PRINTED CIRCUIT BOARD

BACKGROUND OF THE INVENTION

1. Field of the Invention

The present invention relates to printed circuit boards and more particularly, to printed circuit boards (PCBs) with coplanar waveguides and high frequency applications.

2. Related Art

Modern IC devices operate at increasingly higher frequencies. As frequencies of circuits placed on PCBs reach tens of gigahertz, the electrical characteristics of PCB traces resemble high-speed signal transmission lines, rather than DC electrical circuits. The higher frequencies and resultant shorter signal rise times expose PCB performance limitations that are manifested by signal integrity phenomena such as ringing, dielectric losses, reflections, ground bounce, and cross-talk.

Stripline, or microstrip transmission lines, are commonly used as a means of transmitting signals from one portion of the printed circuit board to another. Typically the impedance of the waveguide formed by the stripline or the microstrip structure is matched to 50 ohms.

The microstrip transmission line is a strip conductor that is separated from a ground conductor by a dielectric substrate. However, a problem with the microstrip line is that it has a high transmission loss at high frequencies.

Conventional art has attempted to deal with the problem of losses in the dielectric by turning to exotic materials with relative dielectric constant $\in_r$ of down to approximately 2. However, these materials are typically very expensive, highly flammable, and exhibit poor peel characteristics. The capacitive effects that are created by the presence of the dielectrics, even low $\in_r$ dielectrics, add to system losses, and degrade signal integrity.

As a result, there is a need for structures capable of transmitting high frequency signals, which minimize transmission losses, are of small size, allow for easy and inexpensive fabrication and integration, and still enable desired performance requirements to be met.

SUMMARY OF THE INVENTION

The present invention is directed to a semi-suspended coplanar waveguide on a PCB and a method of its manufacture that substantially obviates one or more of the problems and disadvantages of the related art.

There is provided a printed circuit board including two differential signal traces, a layer of core material, a layer of filler material, and a ground plane. The filler material is replaced by an air core under the differential signal traces.

In another aspect there is provided a method of forming a printed circuit board including forming a stack of layers of filler material and core material over a conductive layer. A channel is formed in the filler material and the core material. A core layer is formed over the channel and over remaining portions of the filler material and the core layer. Signal traces are formed over the channel so as to form an air core waveguide.

In another aspect there is provided a method of forming a printed circuit board including forming a layer filler material over a conductive layer, forming a channel in the filler material, forming a core layer over the channel and over remaining portions of the filler material, and forming signal traces over the channel so as to form an air core coplanar waveguide.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

Figure 1:
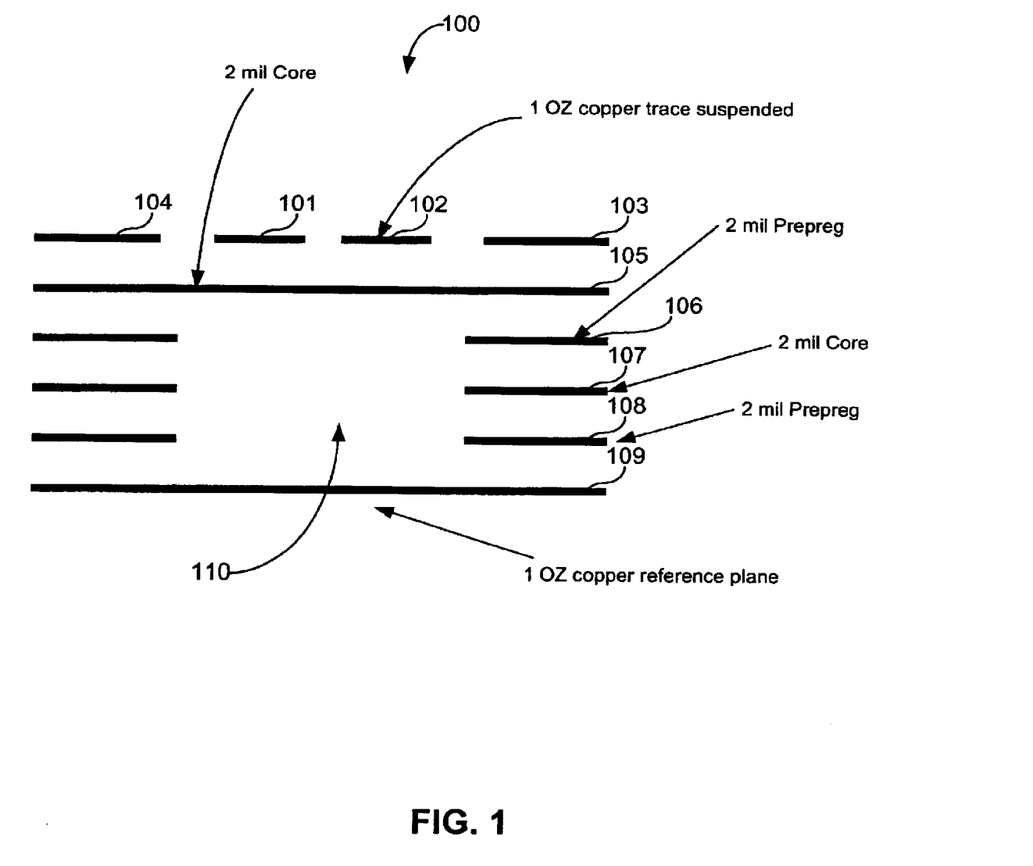
FIG. 1 shows a cross-sectional view of a semi-suspended coplanar waveguide of one embodiment of the invention.

FIG. 1 shows a cross sectional view of the semi-suspended coplanar waveguide of one embodiment of the present invention. As shown in FIG. 1, a PCB 100 includes a suspended differential trace 101 and a suspended differential trace 102. The two differential traces 101, 102 may be made of conductive material, for example, copper or aluminum. The traces also may be gold plated copper. The use of copper is generally preferred.

On the left and right sides of the differential traces 101, 102 are a ground trace 103 and a ground trace 104, respectively. A 2 mil core layer 105 is positioned under the traces 101, 102 and the ground traces 103, 104. The core material may be FR4, or any number of conventional materials used in PCB manufacturing.

A 2 mil prepreg layer 106 is positioned under the core layer 105. The prepreg layer 106 is a filler layer, for example, a fiberglass layer. A 2 mil core layer 107 is stacked below the prepreg layer 106. Another prepreg layer 108 is stacked under the core layer 107. A copper reference plane 109 is at the bottom of the PCB 100. An air core 110 is located below the core layer 105.

Epoxy may be used to attach core material to the copper backing or the traces 101, 102. Epoxy may also be used to attach core material to the prepreg material. It will be appreciated that FIG. 1 is not drawn to scale, and actual thickness of the epoxy "layer" is much smaller than indicated in the figure.

Figure 2:
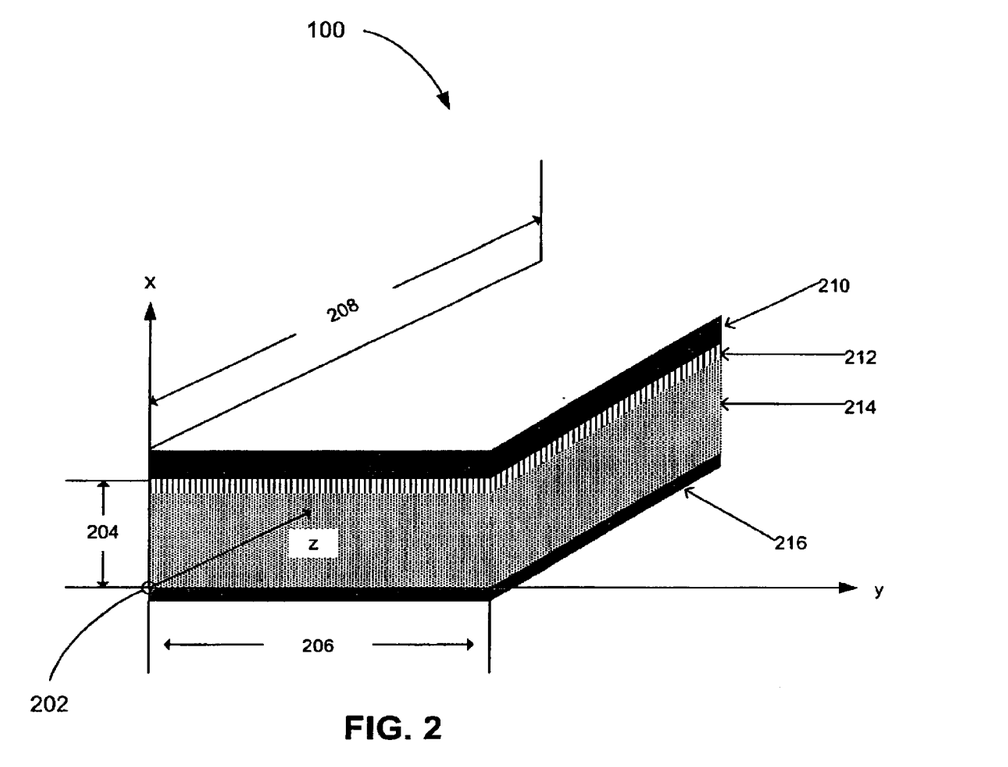
FIG. 2 shows an isometric view of a coplanar waveguide formed on a printed circuit board using the invention.
Figure 3:
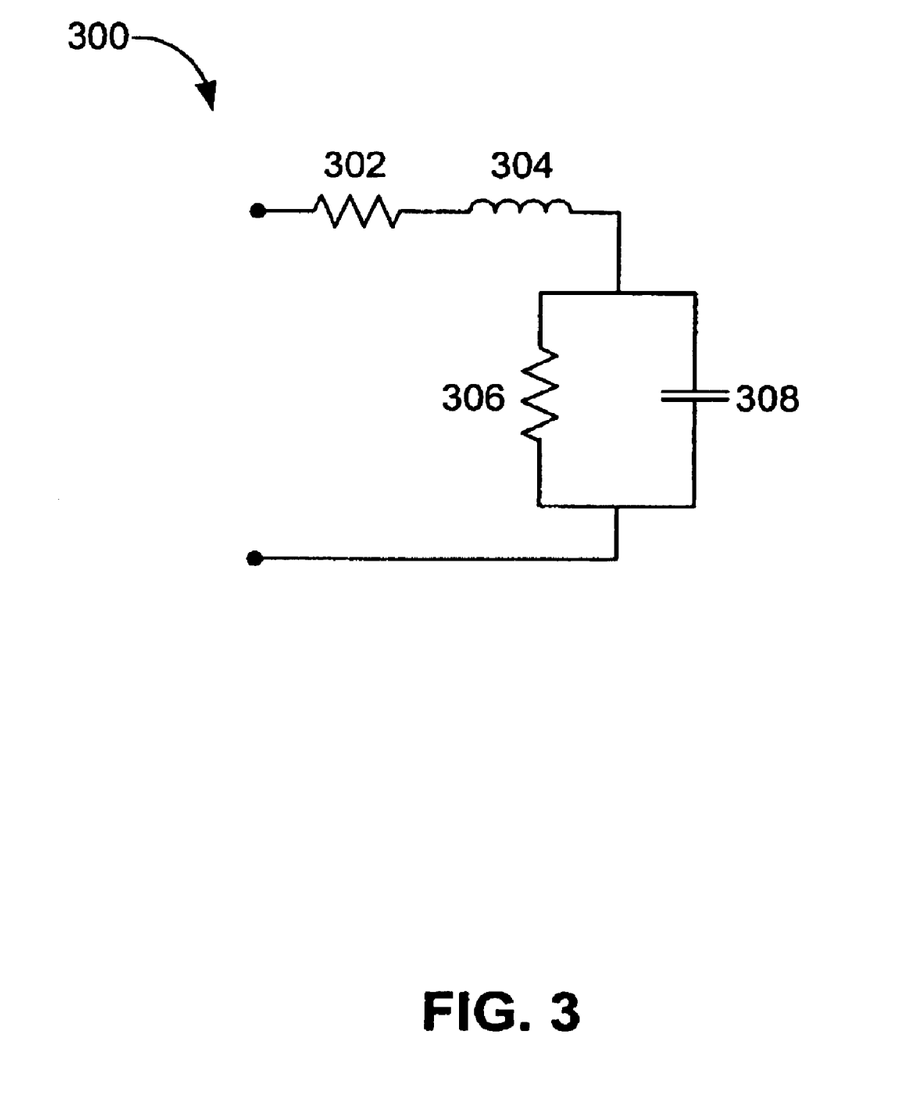
FIG. 3 shows an exemplary diagram of the coplanar waveguide of FIG. 2.

FIG. 2 shows a method of calculating losses in the transmission line formed by the structure shown in FIG. 1. That is, FIG. 2 provides a representation of the PCB 100 for use in deriving equations related to the transmission characteristics of the transmission line depicted in FIG. 1. Specifically, the PCB 100 is shown in FIG. 2 oriented with respect to a three-dimensional axis 202. Further, a trace thickness 204, a trace width 206, and a trace depth 208 of the PCB 100 are shown. The PCB 100, as depicted in FIG. 2, includes a copper trace 210, a FR4 core layer 212, an air dielectric 214, and a ground plane 216. FIG. 3 depicts an equivalent circuit diagram 300 of the PCB 100 shown in FIG. 2. The equivalent circuit diagram 300 includes a surface resistance 302, a line inductance 304, a conductance 306, and a capacitance 308. By using the depiction of the PCB 100 as shown in FIG. 2 along with the equivalent circuit diagram 300 as shown in FIG. 3, the surface resistance of the line is defined as $$R_s = \frac{1}{W \cdot \sigma_{cond} \cdot \delta}$$

and the capacitance is defined as, $$C = \frac{Q}{V} = \frac{\int D \cdot dS}{V} = \frac{\varepsilon_r \int \int E_x dS}{\int E_x dl_x} = \frac{\varepsilon_r \cdot E_x \cdot W}{E_x \cdot d} = \frac{\varepsilon_r \cdot W}{d}.$$

In the above derivation $\in_r$ is the dielectric constant of the core which in this new architecture is approximately equal to 1. The line inductance is defined as $$L = \frac{\int \int B dS}{I} = \frac{\int \int \mu \cdot H_y dS}{I} = \frac{\mu \cdot H_y d}{I} = \frac{\mu \cdot d}{W}.$$

The conductance can be defined as, $$G = \frac{\int \int J \cdot dS}{V} = \frac{\sigma_{diel} \cdot \int \int E_x \cdot dS}{\int E_x \cdot dl_x} = \frac{\sigma_{diel} \cdot E_x \cdot W}{E_x \cdot d} = \frac{\sigma_{diel} \cdot W}{d}$$

where, in the above equations, C is capacitance, Q is charge, V is voltage, D is surface charge density, I is current, σ is conductivity, $\in$ is dielectric constant, dS is differential surface element, W is trace width, l is trace length, d is trace thickness, B is magnetic density, J is current density, $\mu$ is magnetic permeability, H is magnetic intensity, δ is the skin depth, or depth of penetration, of the transmission line, $H_y$ is the magnetic intensity with respect to the y-axis, $E_x$ is the electric field with respect to the x-axis, and $dl_x$ is differential length element relative to the x-axis.

Figure 4:
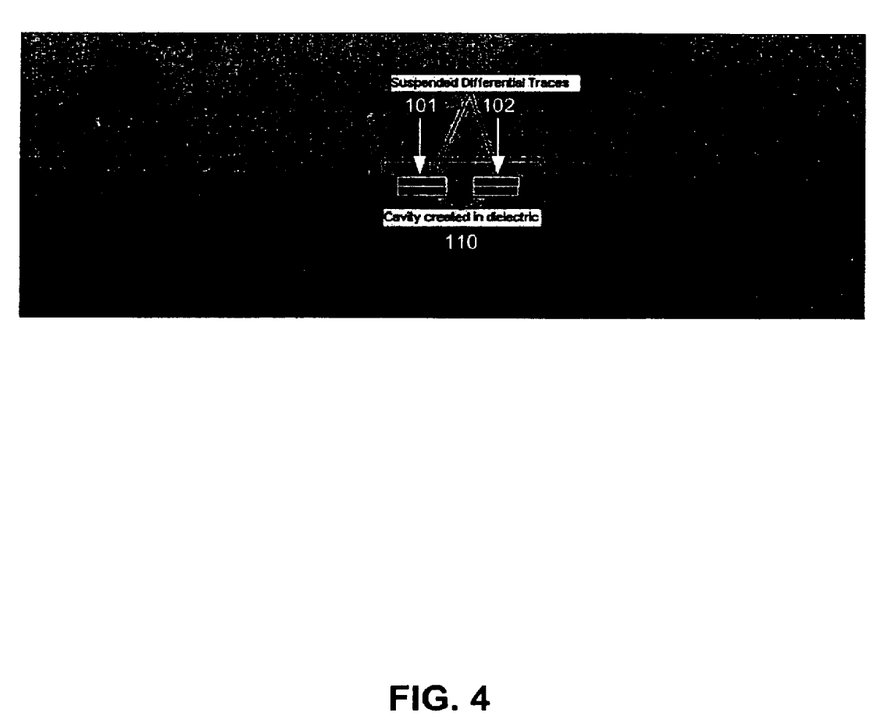
FIG. 4 shows a photograph of a cross-section of a printed circuit board formed according to one embodiment of the present invention.

FIG. 4 is a photograph of a cross section of the printed circuit board of the present invention that utilizes the air gap 110 under the 2 mil core layer 105 (not shown due to the relative dimensions of the various elements shown in the photograph) and the differential traces 101, 102. The "boxed" portion of the photograph corresponds to FIG. 1.

Figure 5:
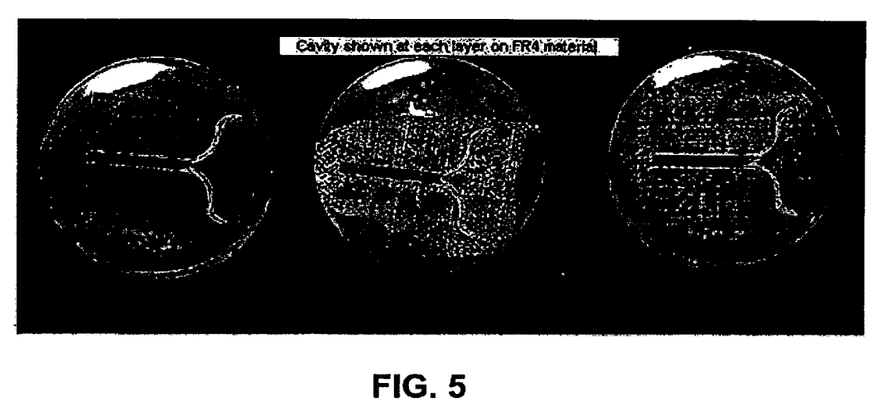
FIG. 5 shows three photographs of a plan view of a printed circuit board, with successive layers being peeled off.

FIG. 5 shows a series of photographs of the printed circuit board as viewed from the top, with successive layers of the core material and prepreg material being peeled off, moving from left to right in the figure.

Figure 6A:
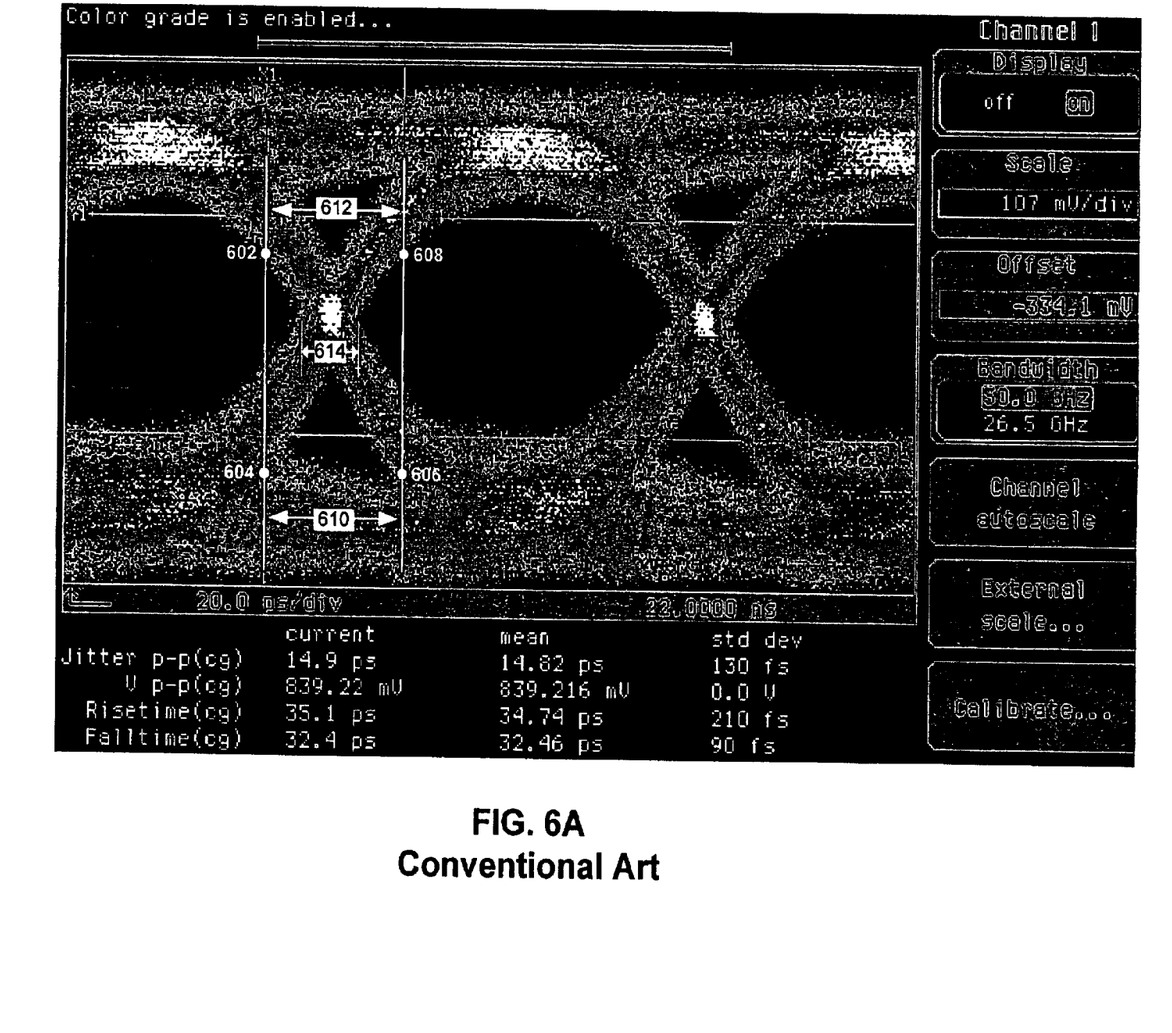
FIGS. 6A and 6B illustrate performance obtained using conventional printed circuit boards with 8 mil cores.
Figure 6B:
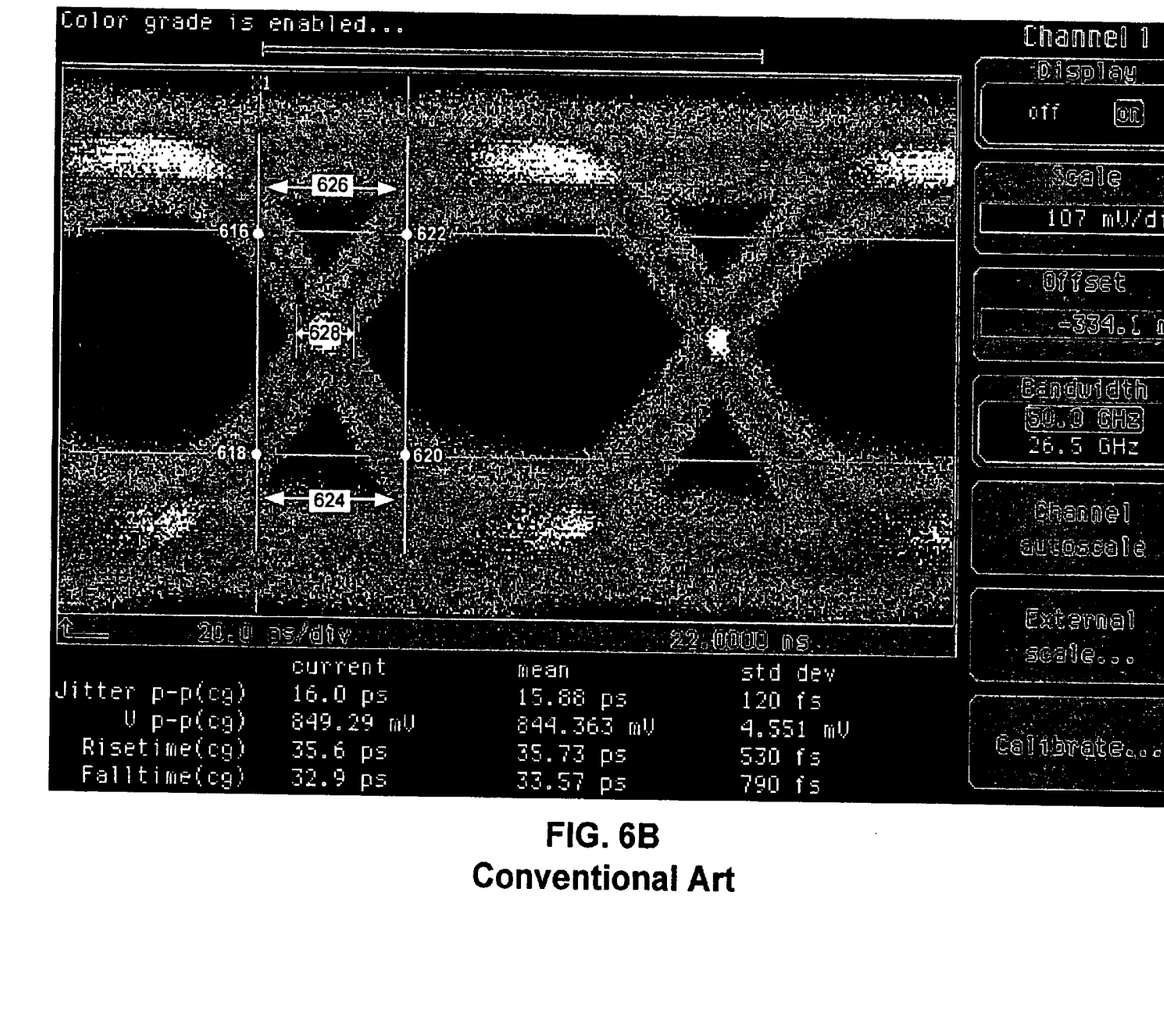

FIGS. 6A–6E illustrate the improvement obtained by the use of the air core (cavity) in a semi-suspended coplanar waveguide. FIGS. 6A–6B show performance obtained using conventional printed circuit boards with 8 mil cores. As may be seen, the jitter is approximately 14–16 picoseconds (ps), the rise times are on order of 35 picoseconds, and the fall times are on the order of 32–33 picoseconds. Specifically, FIG. 6A depicts fall time as the time separation between a trace point 602 and a trace point 606. The time separation between the trace point 602 and the trace point 606 is represented by a fall time indicator 612 as 32.4 ps. FIG. 6A depicts rise time as the time separation between a trace point 604 and a trace point 608. The time separation between the trace point 604 and the trace point 608 is represented by a rise time indicator 610 as 35.1 ps. FIG. 6A depicts jitter as a time overlap 614 at the crossing point of the signal trace between the trace points 604 and 608 and the signal trace between the trace points 602 and 606. The jitter represented by the time overlap 614 is 14.9 ps.

Similarly, FIG. 6B depicts fall time as the time separation between a trace point 616 and a trace point 620. The time separation between the trace point 616 and the trace point 620 is represented by a fall time indicator 626 as 32.9 ps. FIG. 6B depicts rise time as the time separation between a trace point 618 and a trace point 622. The time separation between the trace point 618 and the trace point 622 is represented by a rise time indicator 624 as 35.6 ps. FIG. 6B depicts jitter as a time overlap 628 at the crossing point of the signal trace between the trace points 618 and 622 and the signal trace between the trace points 616 and 620. The jitter represented by the time overlap 614 is 16.0 ps.

Figure 6C:
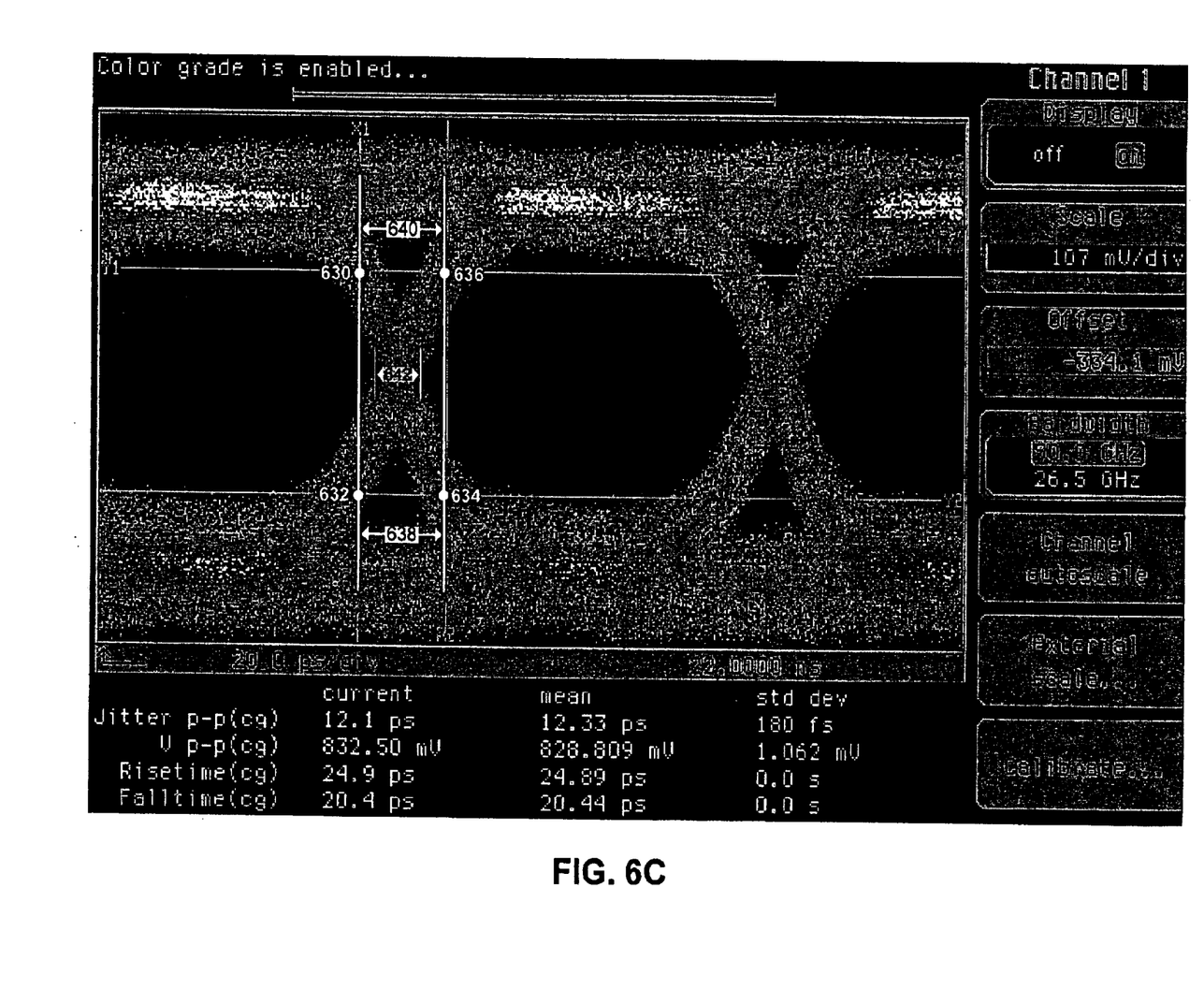
FIGS. 6C, 6D and 6E illustrate improvement in performance obtained using the present invention.
Figure 6D:
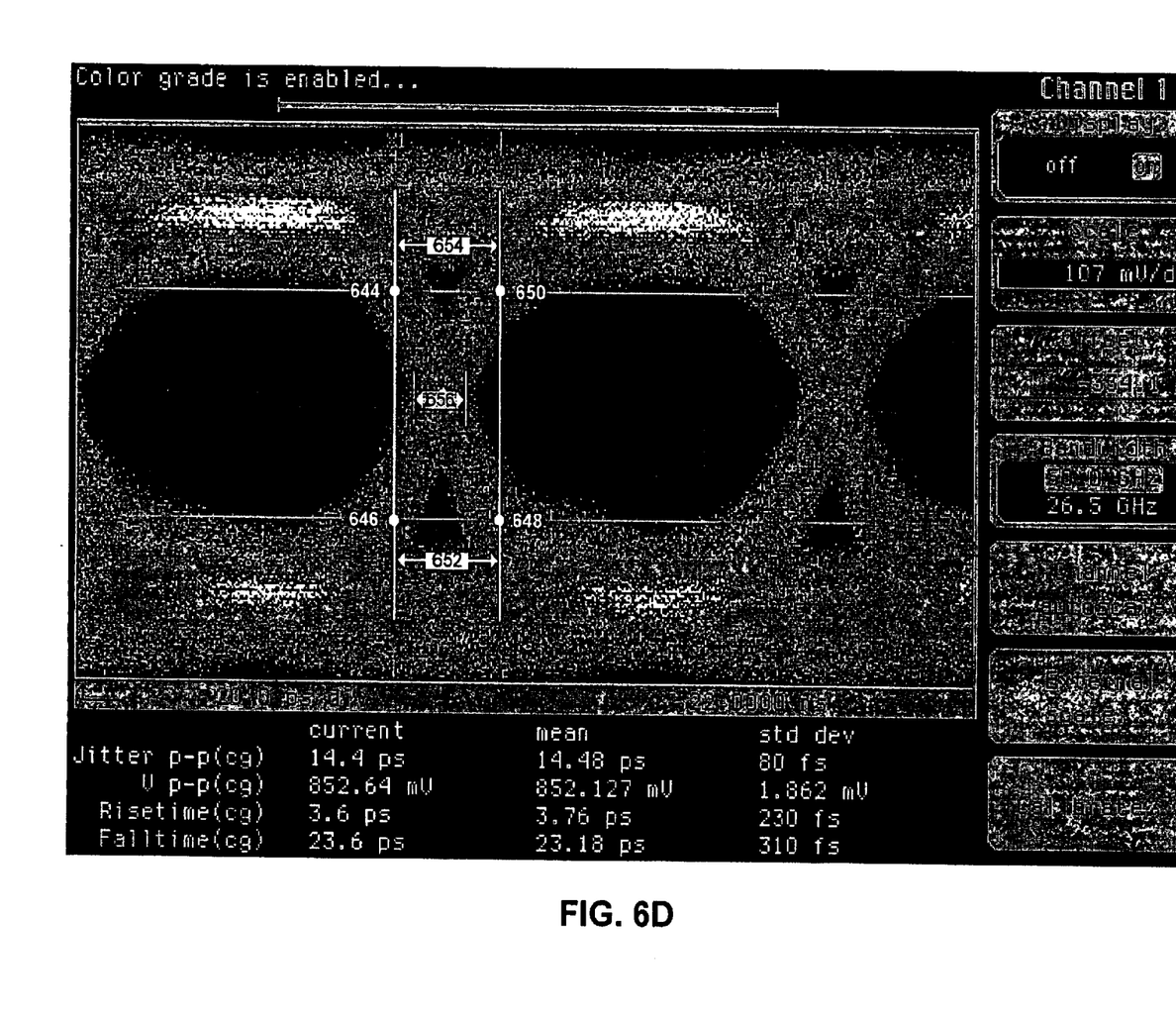

FIGS. 6C–6D show the improvement in performance using the air core of the present invention. As may be seen from FIG. 6C (which has a 2 mil core 105 and 6 mil air gap 110), jitter (depicted as a time overlap 642 at the crossing point of the signal trace between a trace point 632 and a trace point 636 and the signal trace between a trace point 630 and a trace point 634) is reduced down to 12.1 picoseconds, rise time (depicted as the time separation between the trace point 632 and the trace point 636 and represented by a rise time indicator 638 as 24.9 ps) is reduced to under 25 picoseconds, and fall time (depicted as the time separation between the trace point 630 and the trace point 634 and represented by a fall time indicator 640) is reduced down to 20.4 picoseconds, a roughly 30% improvement. Note also that the quality of the eye is substantially improved, with sharper edges, and less ripple.

Figure 7:
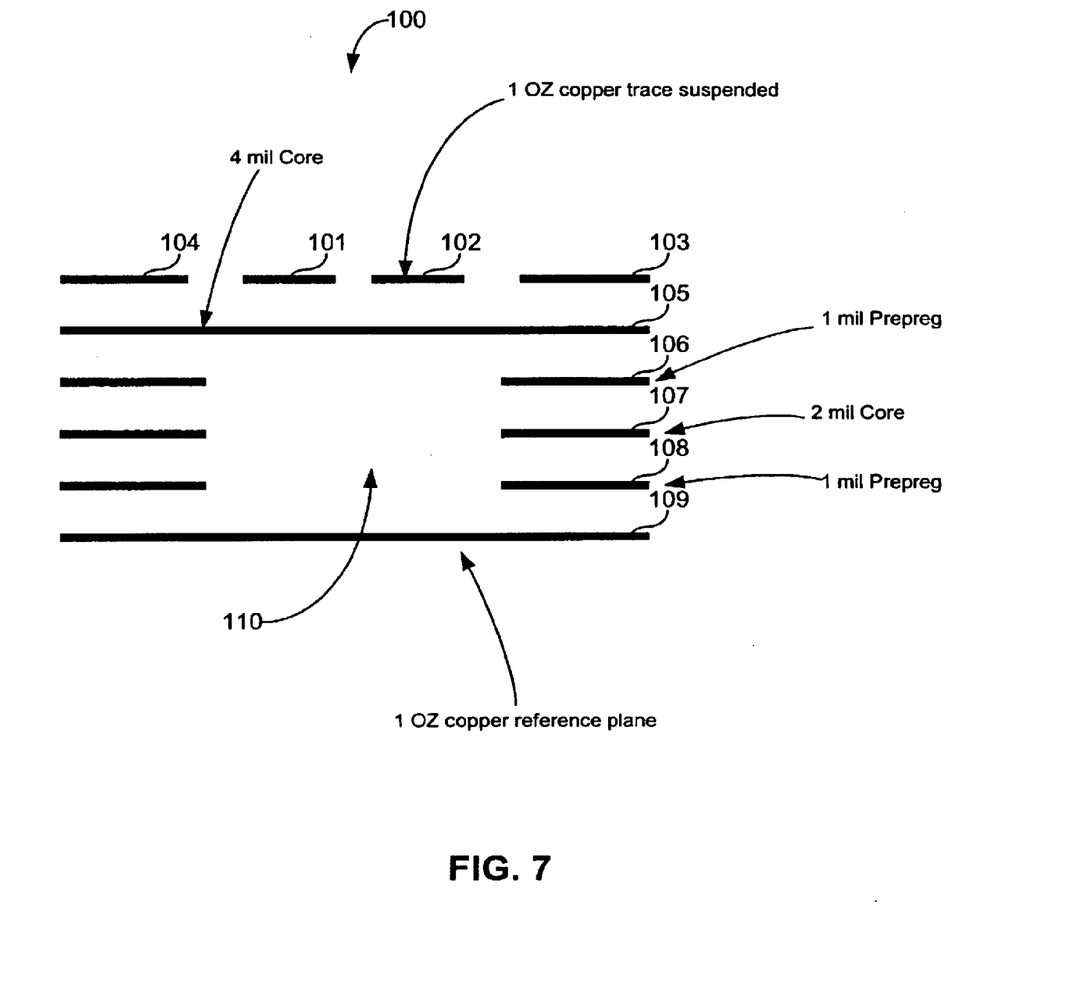
FIGS. 7–8 illustrate alternative PCB structures that correspond to FIGS. 6D–6E.

A similar performance, as shown in FIG. 6D, is obtained with the use of the PCB 100 as shown in FIG. 7 that has a 4 mil core 105 and a 4 mil air core 110. Specifically, FIG. 6D depicts fall time as the time separation between a trace point 644 and a trace point 648. The time separation between the trace point 644 and the trace point 648 is represented by a fall time indicator 654 as 23.6 ps. FIG. 6D depicts rise time as the time separation between a trace point 646 and a trace point 650. Due to falling edge triggering, the rise time displayed on the oscilloscope output is incorrect. However, as shown in FIG. 6D, the rise time is approximately equal to the fall time. Specifically, the time separation between the trace point 646 and the trace point 650 is represented by a rise time indicator 652 as approximately 24 ps. FIG. 6D depicts jitter as a time overlap 656 at the crossing point of the signal trace between the trace points 646 and 650 and the signal trace between the trace points 644 and 648. The jitter represented by the time overlap 656 is 14.4 ps. FIG. 7 shows the PCB 100 as having a suspended differential trace 101 and a suspended differential trace 102. PCB 100, as depicted in FIG. 7, also has a ground trace 103 and a ground trace 104. FIG. 7 also shows a 1 mil prepreg layer 106, a 2 mil core layer 107, a 1 mil prepreg layer 108, and a copper reference plane 109.

Figure 6E:
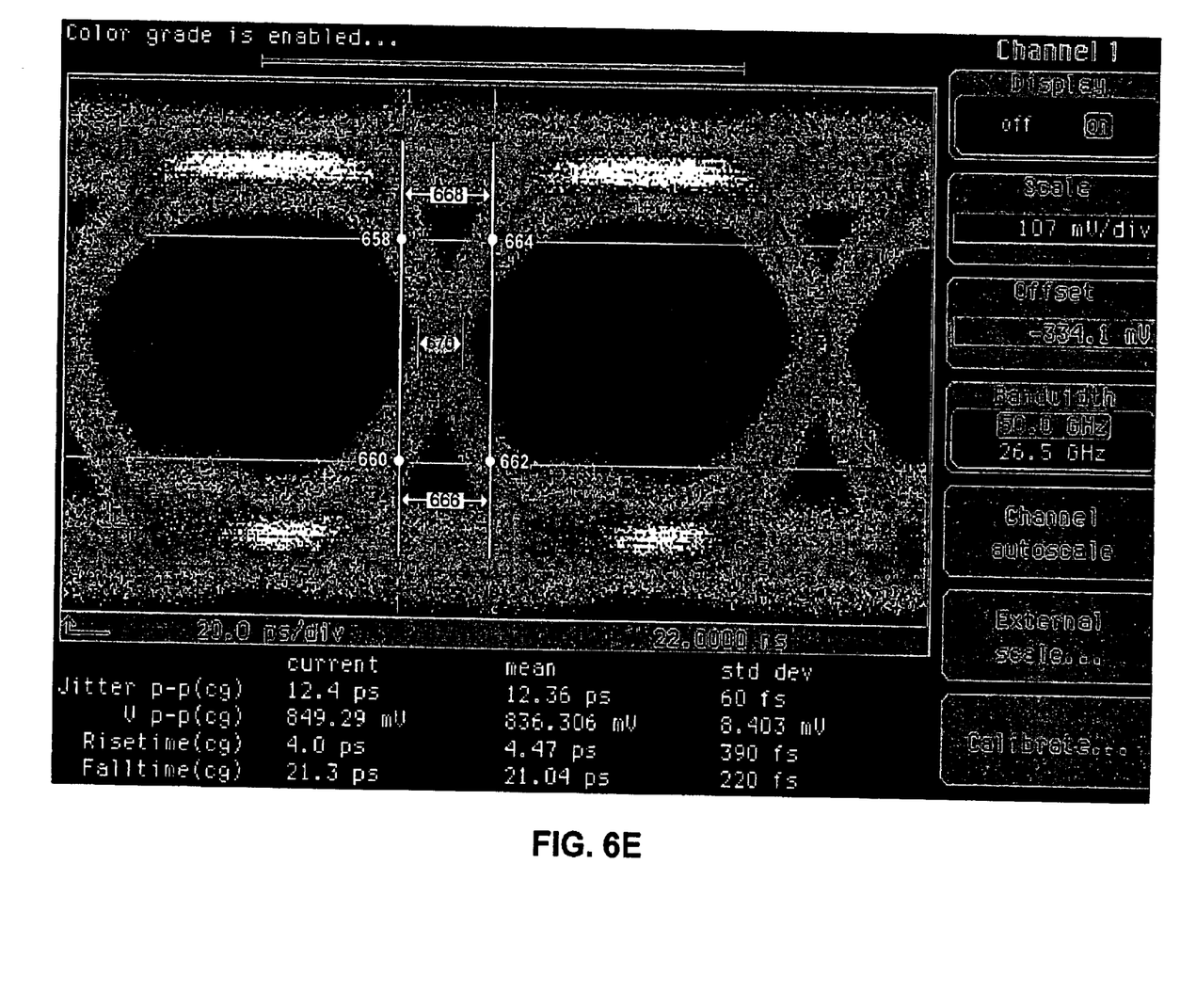
Figure 8:
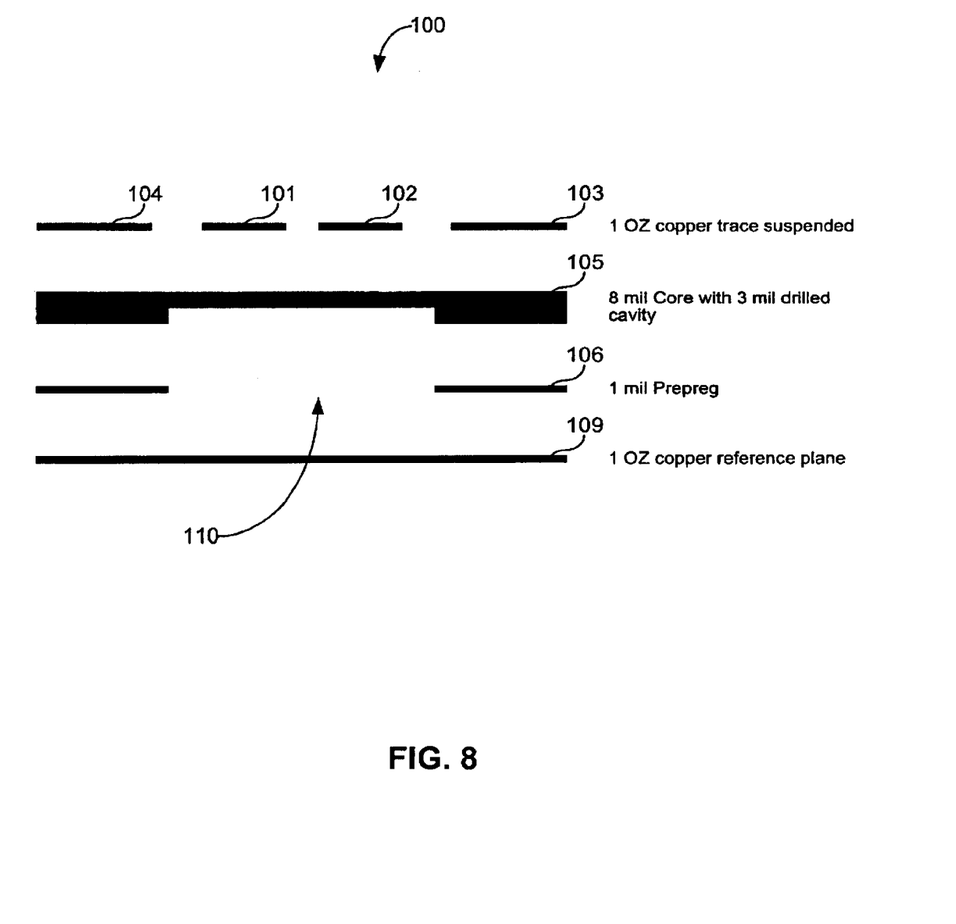

FIG. 6E shows performance of an alternative air core structure where the PCB 100 has an 8mil core with 3 mil drilled cavity 105 and a 4 mil air core 110, as illustrated in FIG. 8, where performance comparable to that shown in FIG. 6D is obtained. Specifically, FIG. 6E depicts fall time as the time separation between a trace point 658 and a trace point 662. The time separation between the trace point 658 and the trace point 662 is represented by a fall time indicator 666 as 21.3 ps. FIG. 6E depicts rise time as the time separation between a trace point 660 and a trace point 664. Due to falling edge triggering, the rise time displayed on the oscilloscope output is incorrect. However, as shown in FIG. 6E, the rise time is approximately equal to the fall time. Specifically, the time separation between the trace point 660 and the trace point 664 is represented by a rise time indicator 668 as approximately 21 ps. FIG. 6E depicts jitter as a time overlap 670 at the crossing point of the signal trace between the trace points 660 and 664 and the signal trace between the trace points 658 and 662. The jitter represented by the time overlap 670 is 12.4 ps.

FIG. 8 depicts the PCB 100 as having as having a suspended differential trace 101 and a suspended differential trace 102. The PCB 100, as depicted in FIG. 8, also has a ground trace 103 and a ground trace 104. FIG. 8 also shows a 1 mil prepreg layer 106 and a copper reference plane 109. Note that generally, the larger air core 110 provides improvement, however, overall configuration needs to be optimized to provide 50 ohm impedance, so as to avoid reflections and other distortions that occur during high frequency operation. Also, trace dimensions (e.g., width) needs to be optimized as well, to provide matched 50 ohm impedance The preferred method of manufacturing the semi-suspended coplanar waveguide of the present invention is through the use of drilling of the channel. Thus, with reference to FIG. 1, layers 109, 108, 107 and 106 may be stacked on top of each other and epoxied together, forming a lower portion of the PCB 100. A numerically controlled drill may then be used to form a channel for the air core 110. The core layer 105 is then placed on top of the air core 10 and the prepreg layer 106. A copper layer is then formed on top of the core layer 105, and the differential signal traces 101, 102, and the ground traces 103, 104 are patterned in the conventional manner. The differential signal traces 101 and 102, as well as the ground traces 103 and 104, can be etched using photomasking.

As an alternative, the air core 110 may be formed using photo masking and etching techniques, although that approach is believed to be considerably more expensive.

Figure 9:
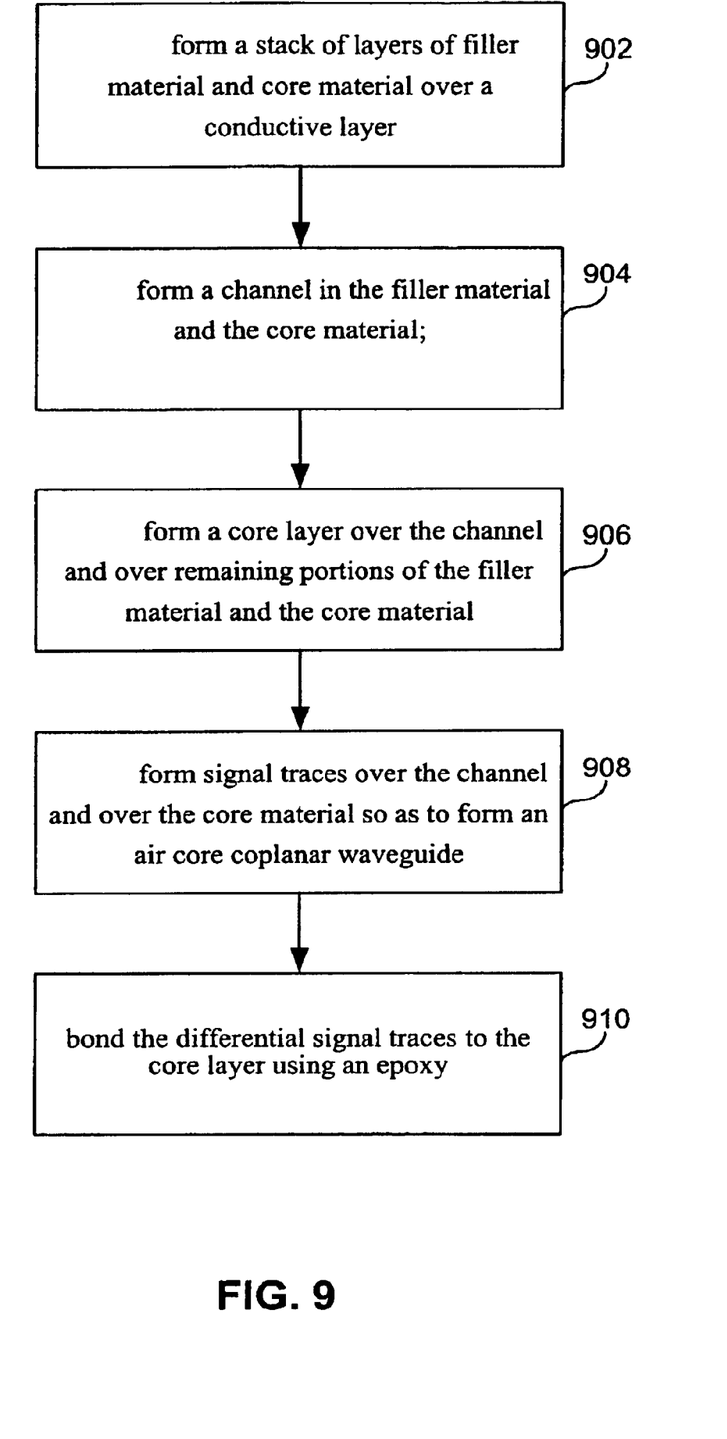
FIG. 9 shows the method of an embodiment of the present invention in flow chart form.

FIG. 9 shows an embodiment of a method of the present invention in flow chart form. A stack of layers of filler material and core material over a conductive layer are formed (step 902). A channel is formed in the filler material and the core material (step 904). A core layer is formed over the channel and over remaining portions of the filler material and the core material (step 906). Signal traces are formed over the channel and over the core material so as to form an air core coplanar waveguide (step 908). The differential signal traces are bonded to the core layer using an epoxy (step 910).

It will also be appreciated that the dimensions specified above are exemplary only, and do not limit the invention described herein.

The present invention results in a transmission structure on a printed circuit board that provides for higher bandwidth, higher signal integrity, less jitter, and lower loss than conventional printed circuit boards. It may be used in such applications as backplanes, transceiver structures, serializer/deserializer structures, etc., particularly where high frequency application (over 1 GHz, and particularly tens of GHz) is required. The present invention also provides an advantage in that it avoids the use of expensive and difficult to work with materials, and utilizes only commercially relatively inexpensive manufacturing techniques.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A printed circuit board comprising:
   a layer of core material;
   two differential signal traces on the layer of core material;
   a layer of filler material below the layer of core material;
   a ground plane; and
   an air core under the two different signal traces and under the layer of core material,
   wherein the layer of filler material comprises a plurality of alternating layers of prepreg and core material.

2. The printed circuit board of claim 1, further comprising a microstrip line waveguide with a relative dielectric constant of approximately 1 formed by the two differential signal traces and the ground plane.

3. The printed circuit board of claim 1, wherein the two differential signal traces comprise copper.

4. The printed circuit board of claim 1, wherein the two differential signal traces comprise aluminum.

5. The printed circuit board of claim 1, wherein the ground plane comprises copper.

6. The printed circuit board of claim 1, wherein a relative dielectric constant of the air core is approximately 1.

7. A printed circuit board comprising:
   a layer of core material;
   two differential signal traces on the layer of core material;
   a layer of filler material below the layer of core material;
   a ground plane; and
   an air core under the two differential signal traces and under the layer of core material,
   wherein the layer of filler material comprises fiberglass.

8. A printed circuit board comprising:
   a layer of core material;
   two differential signal traces on the layer of core material;
   a layer of filler material below the layer of core material;
   a ground plane; and
   an air core under the two differential signal traces and under the layer of core material,
   wherein the two differential signal traces are bonded to the core layer using an epoxy.

9. A printed circuit board comprising:

a layer of core material;

two differential signal traces on the layer of core material;

a layer of filler material below the layer of core material;

a ground plane; and an air core under the two differential signal traces and under the layer of core material, wherein the core material comprises FR-4.

10. A method of forming a printed circuit board comprising:

forming a stack of layers of filler material and core material over a conductive layer;

forming a channel in the filler material and the core material;

forming a core layer over the channel and over remaining portions of the filler material and the core material; and forming differential signal traces over the channel and over the core layer so as to form an air core coplanar waveguide, further comprising the step of bonding the differential signal traces to the core layer using an epoxy.

11. A method of forming a printed circuit board comprising:

forming a stack of layers of filler material and core material over a conductive layer;

forming a channel in the filler material and the core material;

forming a core layer over the channel and over remaining portions of the filler material and the core material; and forming differential signal traces over the channel and over the core layer so as to form an air core coplanar waveguide, wherein the core layer comprises FR-4.

12. A method of forming a printed circuit board comprising:

forming a stack of layers of filler material and core material over a conductive layer;

forming a channel in the filler material and the core material;

forming a core layer over the channel and over remaining portions of the filler material and the core material; and forming differential signal traces over the channel and over the core layer so as to form an air core coplanar waveguide, wherein the filler material comprises fiberglass.

13. A method of forming a printed circuit board comprising:

forming a stack of layers of filler material and core material over a conductive layer;

forming a channel in the filler material and the core material;

forming a core layer over the channel and over remaining portions of the filler material and the core material; and forming differential signal traces over the channel and over the core layer so as to form an air core coplanar waveguide, wherein the core material comprises FR-4.

\* \* \* \* \*

UNITED STATES PATENT AND TRADEMARK OFFICE
CERTIFICATE OF CORRECTION

PATENT NO. : 6,924,712 B2
DATED : August 2, 2005
INVENTOR(S) : Mohammad Tabatabai It is certified that error appears in the above-identified patent and that said Letters Patent is hereby corrected as shown below:

Title page,
Item [56], References Cited, U.S. PATENT DOCUMENTS, insert the following citations:
-- 6,600,395
  5,105,055 --.

Signed and Sealed this

Tenth Day of January, 2006

JON W. DUDAS
*Director of the United States Patent and Trademark Office*